United States Patent

Huang et al.

(10) Patent No.: US 8,524,529 B2
(45) Date of Patent: Sep. 3, 2013

(54) BRACE FOR WIRE BOND

(75) Inventors: Meiquan Huang, Tianjin (CN); Hejin Liu, Tianjin (CN); Hanmin Zhang, Tianjin (CN)

(73) Assignee: Freescale Semiconductor, Inc., Austin, TX (US)

(*) Notice: Subject to any disclaimer, the term of this patent is extended or adjusted under 35 U.S.C. 154(b) by 170 days.

(21) Appl. No.: 13/170,208

(22) Filed: Jun. 28, 2011

(65) Prior Publication Data

US 2012/0077316 A1 Mar. 29, 2012

(30) Foreign Application Priority Data

Sep. 25, 2010 (CN) .......................... 2010 1 0292924

(51) Int. Cl.
*H01L 21/00* (2006.01)
(52) U.S. Cl.
USPC ............................. 438/106; 438/123; 257/784
(58) Field of Classification Search
USPC ................... 438/106–127; 257/784
See application file for complete search history.

(56) References Cited

U.S. PATENT DOCUMENTS

| | | |
|---|---|---|
| 5,200,362 A | 4/1993 | Lin |
| 5,273,938 A | 12/1993 | Lin |
| 6,348,726 B1 | 2/2002 | Bayan |
| 6,426,563 B1 * | 7/2002 | Fujihira .......................... 257/780 |
| 6,476,503 B1 * | 11/2002 | Imamura et al. ................ 257/780 |
| 6,476,506 B1 * | 11/2002 | O'Connor et al. .............. 257/786 |
| 7,256,488 B2 * | 8/2007 | Zhou et al. ...................... 257/690 |
| 7,347,352 B2 | 3/2008 | Qin |
| 2004/0124545 A1 | 7/2004 | Wang |
| 2007/0105280 A1 | 5/2007 | Li |
| 2007/0182026 A1 * | 8/2007 | Nishiura ........................ 257/784 |
| 2008/0116548 A1 | 5/2008 | Li |
| 2009/0160595 A1 * | 6/2009 | Feng et al. ..................... 438/123 |

* cited by examiner

*Primary Examiner* — Fernando L Toledo
*Assistant Examiner* — Bryan Junge
(74) *Attorney, Agent, or Firm* — Charles Bergere

(57) ABSTRACT

An electrical connection includes a first wire having one end stitch bonded to a surface, such as the lead finger of a lead frame or the connection pad of a substrate. A second wire has a first end attached to the surface on a first side of the first wire and a second end attached to the surface on a second, opposing side of the first wire. The second wire acts as a brace that prevents the first wire from lifting off of the surface. If necessary, a third wire can be added that, like the second wire, acts as a brace to prevent the first wire from lifting off of the surface.

13 Claims, 1 Drawing Sheet

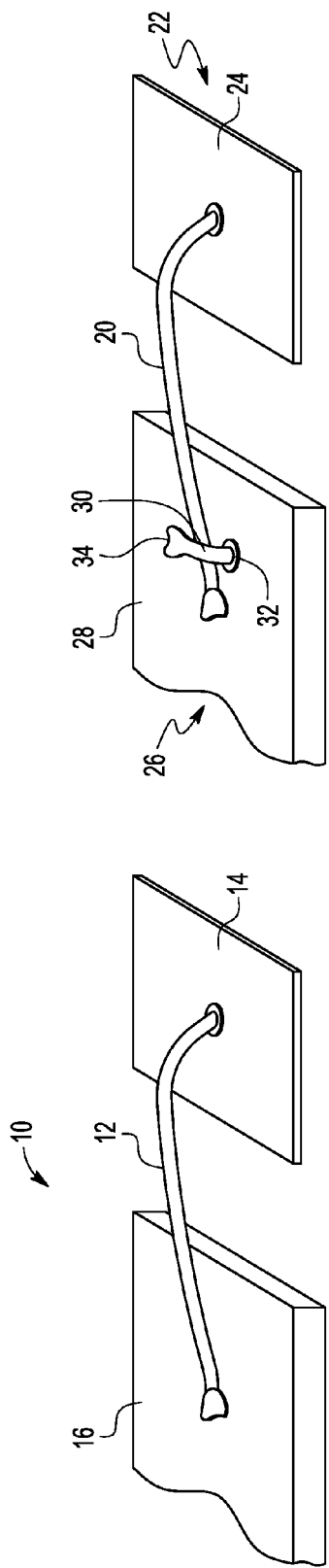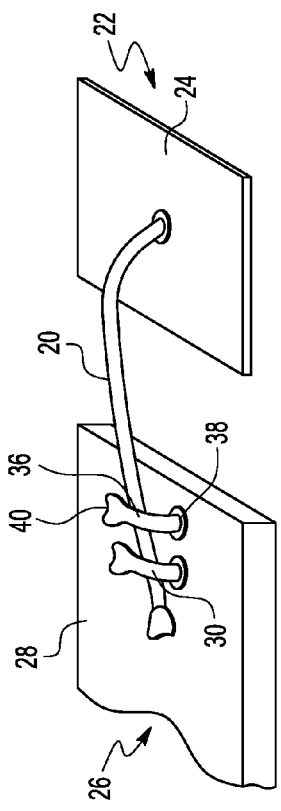
FIG. 2
FIG. 3
FIG. 1
-PRIOR ART-

BRACE FOR WIRE BOND

BACKGROUND OF THE INVENTION

The present invention relates to semiconductor packaging in general and more specifically to a brace for a wire bond.

Wire bonding typically involves connecting a bond pad on an integrated circuit (IC) die to a lead finger of a lead frame with a bonding wire. Referring to FIG. 1, a conventional wire bond 10 is shown in which a wire 12 has one end attached to a bond pad 14 of an integrated circuit with a ball bond and a second end attached to a lead finger 16 of a lead frame (or to a connection pad of a substrate) with a stitch bond.

As is known by those of skill in the art, the wire 12, and particularly the stitch bond, is susceptible to damage, cracking, or breaking when impacted by outside forces, such as a mold compound during an encapsulation process. This problem is even more acute for shorter or thinner wires.

Thus, it would be advantageous to have a wire bond that is secure and not readily be damaged by outside forces.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

FIG. 1 is an enlarged perspective view of a conventional wire bond;

FIG. 2 is an enlarged perspective view of a secure wire bond in accordance with an embodiment of the present invention; and FIG. 3 is an enlarged perspective view of a secure wire bond in accordance with another embodiment of the present invention.

DETAILED DESCRIPTION OF THE INVENTION

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

The present invention provides a method of connecting a lead frame lead finger to a bond pad on an integrated circuit (IC) die. The method includes the steps of bonding a first bonding wire from the integrated circuit bond pad to a lead finger of a lead frame and then securing the wire-to-lead finger connection with a second wire. In another embodiment of the invention, the wire-to-lead finger connection is secured with an additional, third wire.

The present invention also provides a secure stitch bond including one end of a first wire stitch bonded to a connection pad; and a second wire disposed over the first wire proximate to the stitch bond that secures the stitch bond. In an alternate embodiment, a third wire is disposed over the first wire proximate to the second wire to provide additional force for securing the stitch bond of the first wire. The third wire may be generally parallel to the second wire, at an angle with respect to the second wire, or in one embodiment, may cross the second wire.

Referring now to FIG. 2, an enlarged perspective view of a brace for a wire bond or a secure stitch bond is shown. In FIG. 2, a first wire 20 has a first end 22 bonded to a first surface 24. As can be seen, the first end 22 is ball bonded to the first surface 24. A second end 26 of the first wire 20 is attached to a second surface 28. The first wire 20 lies at an angle of less than 90° with respect to the second surface 28. Typically, this connection is formed with a stitch bond. The first wire 20 electrically connects the first and second surfaces 24 and 28. The first and second surfaces 24, 28 may be, for example, a bonding pad of an integrated circuit and a lead finger of a lead frame. In one alternative, the second surface 28 may be the connection pad of a substrate or printed circuit board (PCB). The first wire 20 may be any electrically conductive wire, such as Gold or Copper wire, and either bare or coated. In the example shown, the wire 20 comprises a 1.3 mil Gold wire as is commonly used in semiconductor packaging.

A second wire 30 has a first end 32 attached to the second surface 28 on a first side of the first wire 20 and a second end 34 attached to the second surface 28 on a second, opposing side of the first wire 20. The second wire 30 thus loops over the first wire 20 proximate to the second end 26 of the first wire 20. The second wire 30 prevents the first wire 20 from lifting off of the second surface 28 when the first wire 20 is subjected to external forces, such as due to handling or during an encapsulation process in which mold compound is disposed over the wire 20 and the first and second surfaces 24 and 28. In this regard, the second wire 34 may be in contact with the first wire 20 at the point where the second wire 30 crosses over the first wire 20.

The second wire 30 may be attached to the second surface 28 using conventional wire bonding equipment. Also, the second wire 30 is preferably the same as the first wire 20. Thus, if the first wire 20 is a 1.3 mil Gold wire, then the second wire 30 also preferably is a 1.3 mil Gold wire. In a preferred embodiment of the invention, the second wire 30 is attached to the second surface 28 with a ball bond followed by a stitch bond.

Referring now to FIG. 3, an enlarged perspective view of an alternate embodiment of the present invention is shown. In this embodiment, which is similar to the embodiment shown in FIG. 2, a third wire 36 having a first end 38 attached to the second surface 28 on the first side of the first wire 20 and a second end 40 attached to the second surface 28 on the second side of the first wire 20 is provided. The third wire 36 also prevents the first wire 20 from lifting off of the second surface 28. In the embodiment shown, the third wire 36 is parallel to and spaced from the second wire 30, although this is not required. For example, the second and third wires 30, 36 could be very close together such that the spacing therebetween is mostly imperceptible; on the other hand, the second and third wires 30, 36 could be spaced from each other by the maximum distance permitted by the size of the second surface 28. While in the embodiment shown the third wire 36 is generally parallel to the second wire 30, the third wire 36 could be disposed at an angle with respect to the second wire 30, or in one embodiment, the third wire 36 may cross the second wire 30. Like the second wire 30, the third wire 36 preferably is ball bonded and then stitch bonded to the second surface 28 using currently available wire bonding equipment.

As is evident from the foregoing discussion, the present invention provides a method of securing a stitch bond to a connection pad, where the connection pad can be either a lead finger of a lead frame or a connection pad of a substrate such as a PCB.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

The invention claimed is:

1. A method of securing a bond wire to a surface, comprising:
    forming a first wire bond by attaching a first wire to the surface, wherein a mechanical connection and an electrical connection are created between the first wire and the surface;
    bonding a first end of a second wire to the same surface on one side of the first wire; and
    bonding a second end of the second wire to the same surface on a second, opposing side of the first wire such that the second wire prevents the first wire from lifting off of the surface,
    wherein the surface is a lead finger of a lead frame or a substrate bonding pad.

2. The method of securing a bond wire to a surface of claim 1, wherein the first wire lies at an angle of less than ninety degrees with respect to the surface.

3. The method of securing a bond wire to a surface of claim 2, wherein the first wire bond comprises a stitch bond.

4. The method of securing a bond wire to a surface of claim 1, wherein the first wire bond is formed using a wire bonding apparatus.

5. The method of securing a bond wire to a surface of claim 1, wherein the second wire is in contact with the first wire.

6. The method of securing a bond wire to a surface of claim 1, further comprising:
    bonding a first end of a third wire to the same surface on one side of the first wire; and
    bonding a second end of the third wire to the same surface on an opposing side of the first wire such that the third wire, in addition to the second wire, clamps the first wire to the surface.

7. The method of securing a bond wire to a surface of claim 6, wherein the third wire is arranged parallel to the second wire.

8. The method of securing a bond wire to a surface of claim 6, wherein the third wire is in contact with the first wire.

9. The method of securing a bond wire to a surface of claim 6, wherein the first, second and third wires are attached to the surface using a wire bonding apparatus.

10. A method of securing a bond wire to a surface comprising:
    forming a first wire bond by attaching a first wire to the surface with a stitch bond;
    bonding a first end of a second wire to the same surface on one side of the first wire bond; and
    bonding a second end of the second wire to the same surface on a second, opposing side of the first wire such that the second wire prevents the first wire from lifting off of the surface,
    wherein the first and second wires are attached to the surface using a wire bonding apparatus and the surface is a lead finger of a lead frame or a substrate bonding pad.

11. An electrical connection, comprising:
    a first wire having one end thereof stitch bonded to a surface; and
    a second wire having a first end attached to the same surface on a first side of the first wire and a second end attached to the same surface on a second, opposing side of the first wire, wherein the second wire prevents the first wire from lifting off of the surface,
    wherein the surface is a lead finger of a lead frame or a substrate bonding pad.

12. The electrical connection of claim 11, further comprising a third wire having a first end attached to the surface on the first side of the first wire and a second end attached to the surface on the second side of the first wire, wherein the third wire also prevents the first wire from lifting off of the surface.

13. The electrical connection of claim 12, wherein the third wire is generally parallel to the second wire.

* * * * *